United States Patent

Richard

[15] 3,663,921

[45] May 16, 1972

[54] RECEPTACLE FOR CONNECTING SEMICONDUCTORS TO A CIRCUIT BOARD

[72] Inventor: Donald F. Richard, Saratoga, Calif.

[73] Assignee: American Micro-Systems, Inc., Santa Clara, Calif.

[22] Filed: July 7, 1970

[21] Appl. No.: 52,803

[52] U.S. Cl. ................339/17 CF, 174/DIG. 3, 317/101 CP, 339/275 B

[51] Int. Cl. ..........................................................H05k 1/02

[58] Field of Search ..................174/DIG. 3; 317/100, 101 R, 317/101 C, 101 CC, 101 D, 101 DH, 101 CP; 339/17 R, 17 C, 17 D, 17 E, 17 L, 17 LC, 17 LM, 17 M, 17 CF, 17 N, 17 T, 75 MP, 75 R, 75 M, 176 M, 176 MP, 176 R, 64 M, 125, 126, 275 B, 275 R, 198 R

[56] References Cited

UNITED STATES PATENTS

| | | | |
|---|---|---|---|
| 3,243,660 | 3/1966 | Yuska et al. | 317/100 |
| 3,430,186 | 2/1969 | Herb et al. | 339/176 MP X |
| 3,408,611 | 10/1968 | Katz | 339/176 MP X |
| 3,315,217 | 4/1967 | Bird | 339/275 R X |
| 3,340,439 | 9/1967 | Henschen et al. | 339/17 CF X |
| 3,248,779 | 5/1966 | Yuska et al. | 317/101 CC X |
| 3,142,000 | 7/1964 | Bernstein | 317/101 CP |

FOREIGN PATENTS OR APPLICATIONS

| | | | |
|---|---|---|---|
| 719,657 | 12/1945 | Great Britain | 339/176 MP |
| 1,079,829 | 8/1967 | Great Britain | 339/176 MP |

*Primary Examiner*—Marvin A. Champion
*Assistant Examiner*—Terrell P. Lewis
*Attorney*—Owen, Wickersham & Erickson

[57] ABSTRACT

A receptacle for installation on one surface of a circuit board for supporting a semiconductor package of the type having bonding pads along one side and providing an interconnection being the package and the circuit board. The receptacle has a generally channel-shaped planform with a series of contact members spaced apart along a central body section. The contact members extend upwardly and outwardly from one side and register with bonding pads of the package. The lower ends of the contact members extend through the circuit board for connection with lead terminals on its other surface.

2 Claims, 7 Drawing Figures

Patented May 16, 1972 3,663,921
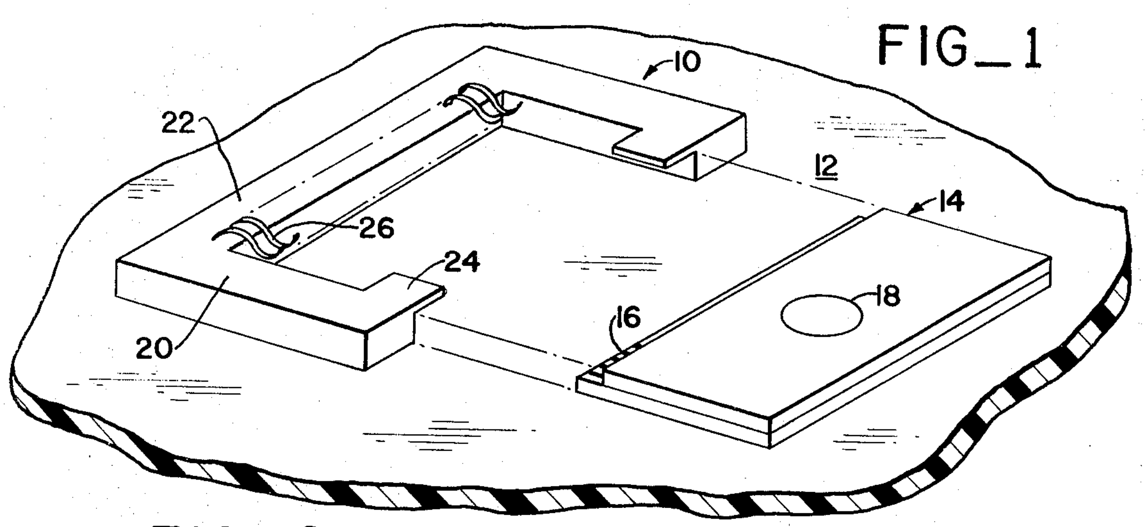
FIG_1
FIG_2
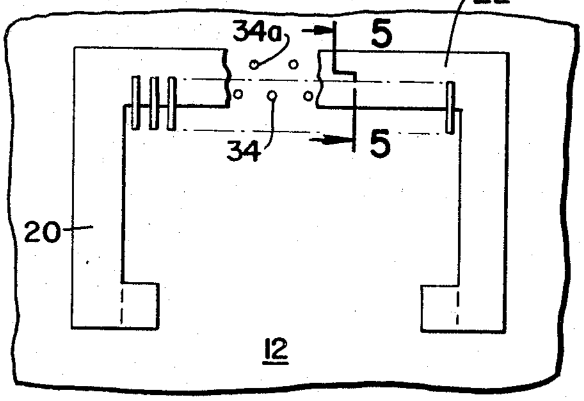
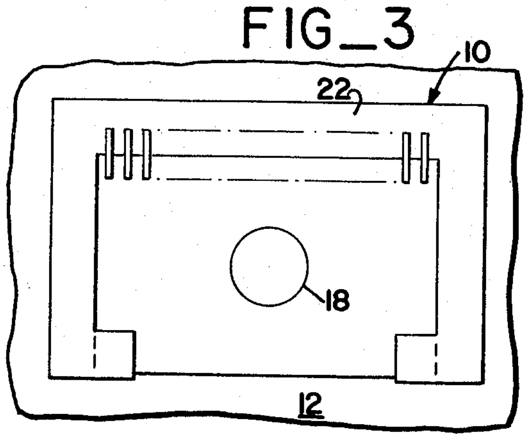
FIG_3
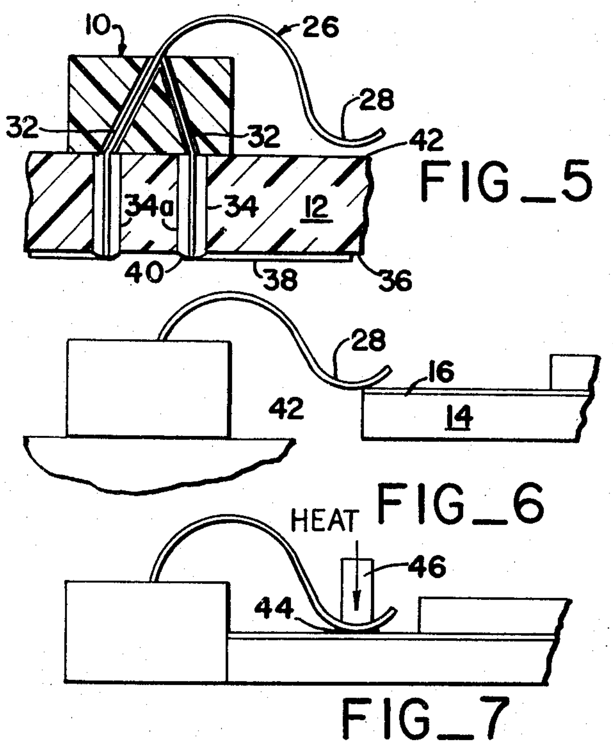
FIG_5, FIG_6
FIG_7
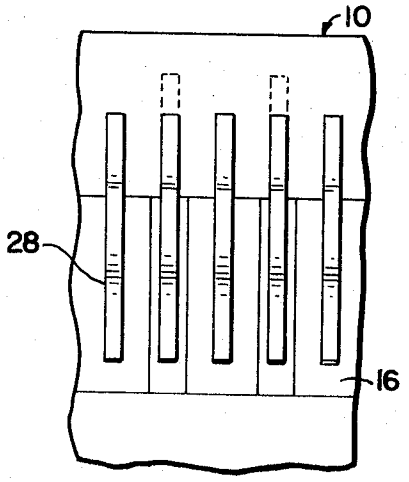
FIG_4
INVENTOR.
DONALD F. RICHARD
BY
Owen, Wickersham & Erickson
ATTORNEYS

RECEPTACLE FOR CONNECTING SEMICONDUCTORS TO A CIRCUIT BOARD

This invention relates to a device for mounting a semiconductor package on and interconnecting it to a circuit board.

Semiconductor devices such as integrated micro circuit devices in the form of extremely small dies or "chips" are packaged within or mounted on flat pieces of ceramic or plastic material. On such packages the terminal pads of the integrated circuit die or chip are connected to lead paths on the surface of the package. In one widely used form of such a package, these surface lead paths extend to spaced apart bonding pads along one edge of the package. Heretofore, a problem arose of how to install or attach such "edgemount" packages to a circuit board. Placing the package on edge perpendicular to the board proved to be unsatisfactory since reliable connections between the package pads and the board were difficult to produce, and the arrangement required considerable space. Since large numbers of such packages are often required for various electronic apparatus, the speed and economy with which the packages can be installed on circuit boards with durable connections become increasingly vital factors in the manufacture of such apparatus.

A general object of the present invention is to solve the aforesaid package installation problem by providing an improved device for installing and electrically connecting an edgemount type semiconductor package on a circuit board.

Another object of the present invention is to provide a receptacle device adapted for mounting on circuit boards that will facilitate the installation of semiconductor packages with greater speed and yet will provide better and more durable electrical connections.

Another object of the present invention is to provide a receptacle device for installation on circuit boards that will facilitate electrical connections between the package pads or terminals and the circuit board device that are readily visible, can be easily inspected and can be quickly and easily disconnected if it becomes necessary to remove and replace the package.

Another object of the present invention is to provide a device for installation on circuit boards that will keep the overall thickness of the circuit board and packages to a minimum.

The aforesaid and other objects are accomplished by a receptacle device which is fixed to a circuit board in a position to receive a semiconductor edgemount type package having a series of bonding pads spaced apart alone one side. The receptacle is provided with a series of yieldable contact members that have the same spacing as the bonding pads of the package. These contact members extend through the receptacle device and the circuit board to its lower surface where the ends of the contact members are joined to appropriate conductive paths on the circuit board. The receptacle is channel or U-shaped in planform so that it will receive the semiconductor package lying flat on the upper surface of the circuit board and when the package is within the receptacle its edge pads automatically register with and are engaged by the contact members. A clad material is provided on either the contact members or the package bonding pads so that heat applied to contact members on the pads will form a soldered connection between them.

Other objects, advantages and features of the invention will become apparent from the following detailed description of one embodiment taken in conjunction with the accompanying drawing, in which:

FIG. 1 is a fragmentary view in perspective of a circuit board with a receptacle embodying the principles of my invention with a semiconductor package positioned for entry into it;

FIG. 2 is a fragmentary plan view of the circuit board shown in FIG. 1;

FIG. 3 is a plan view similar to FIG. 2 showing the package installed within the receptacle;

FIG. 4 is an enlarged fragmentary plan view of a package within my receptacle;

FIG. 5 is an enlarged view in section taken along line 4—4 of FIG. 2;

FIG. 6 is a view in elevation showing the initial position of the receptacle contacts as the passage is inserted;

FIG. 7 is a view in elevation similar to FIG. 6 showing one method for bonding the contacts to the package pads.

With reference to the drawing, FIG. 1 shows a receptacle 10 embodying the principles of the present invention as it appears when installed on a circuit board 12 and ready to receive a semiconductor package 14. The semiconductor package, as shown, is the "edgemount" type which has a series of bonding pads 16 spaced apart along one edge. These bonding pads are generally the end portions of surface lead paths on the package which extend to and converge near a central pad on the package. Mounted on this central pad is a semiconductor die or integrated circuit device which is enclosed within a protective container 18 wherein the circuit device is electrically connected to the inner ends of the lead paths. Various forms of semiconductor packages have been developed with different constructions and it should be understood that the present invention is not limited to any particular form of package as long as it is one having bonding pads or lead portions spaced apart along or near one of its edges.

The receptacle 10, as seen in FIGS. 2 and 3, is generally U-shaped in planform, with a pair of parallel arm portions 20 that extend from the ends of an elongated central body portion 22. These arm portions are spaced apart a distance that is slightly greater than the length of a semiconductor package 14 which is adapted to be installed in the receptacle. Extending inwardly from the inner and upper edge of each arm is a retaining tab 24 that overlaps the package when it is in place to help retain it in position. Other means for holding the package in place could be used in lieu of these tabs, such as clips or screws. Preferably, the arms and body portion of this receptacle are made as a single integral member from some non-conductive plastic or ceramic material, which may be the same material as used for the package.

Fixed within the body portion 22 at spaced apart intervals are a plurality of metallic contact members 26, there being at least one for every bonding pad 16 of the semiconductor package 14. These wire-like contact members may be made of any suitable metallic material such as steel so as to be semi-rigid and they extend substantially perpendicular to the body portion and outwardly therefrom between the receptacle arms 20. Each contact member has an upper portion that is generally S-shaped in elevation with an extreme outer end portion 28 that may originally extend below the top surface 30 of the receptacle. As shown in FIG. 5, the upper portions of all the contact members may enter the top surface 30 of the receptacle along a line parallel to a longitudinal axis of the receptacle body member. However, within the receptacle body, I may bend the lower portions 32 of alternate contact members 26 in different directions. Thus, from the bottom surface of the receptacle body portion 22, these lower portions of alternate contact members 26 extend from two spaced apart longitudinal lines. This alternate bending feature allows the upper portions 28 of the contact members 22 to be spaced close enough together on the receptacle body so that they can register with the bonding pads 16 of the semiconductor package. Yet, their lower ends 32 are spaced far enough apart to be compatible with the spacing of lead terminals on a circuit board. For example, a standard spacing for bonding pads on a semiconductor package may be 50 mils whereas a desired spacing for circuit board terminals may be 100 mils. As shown in FIG. 2, the circuit boards may be provided with a plurality of holes 34 and 34*a* at this critical spacing before the receptacle is mounted thereon. With the lower portions of adjacent contact members bent in different directions, as shown in FIG. 3, they can extend downwardly from the lower surface of the receptacle and through the holes 34 and 34*a* in the circuit board.

The receptacle may be installed on a circuit board by use of a suitable bonding cement or by fasteners such as rivets. Normally, the circuit board will be pre-drilled to provide the openings 34 and 34*a* at the correct spacing to receive the lower portions 32 of the contact members 26. Initially, the contact members may extend below the bottom surface 36 of the circuit board. When the receptacle has been fixed in place these bottom ends can be bonded to the circuit board leads 38 by filling the openings around each contact member with solder 40 in the conventional manner (FIG. 5).

The procedure for installing a semiconductor package 14 within one of my receptacles 10 may be carried out quickly without highly skilled labor, as shown in FIGS. 1, 6 and 7. Initially, the semiconductor package is placed with its bottom side flush against the top surface 42 of the circuit board. It is then merely pushed into the receptacle under the retaining tabs 24 until its front edge having the bonding pads engages the curved up ends of the contact members. The side arms 20 of the receptacle 10 serve as guides for the package so that its bonding pads 16 register with the proper contact members 26. When the contact members are first engaged (FIG. 6) they are cammed upwardly and move over the bonding pads as the edge of the package moves further and eventually abuts against the receptacle's central portion (FIG. 7). At this point, each contact member of the receptacle is directly above or engaging a bonding pad. Preferably, the contact members or the bonding pads when made are clad with a bonding metal or solder 44. Thus, using a single application of an elongated iron 46, as shown in FIG. 7, all of the contact members can be soldered simultaneously to their respective bonding pads.

While the invention has been illustrated by reference in the drawing to a circuit board showing one receptacle it is apparent that in practice other circuit boards, mounting bases or other chassis devices may be used which can accommodate one or a plurality of receptacles. The present invention provides a solution to the problem of mounting semiconductor packages requiring a multiplicity or bonded connections in a manner that is relatively inexpensive, less time consuming to install and one that requires no special skill or technique to achieve good, reliable connections. Particularly important is the fact that all connections between contact members and bonding pads are readily visible and can be easily inspected. Also, if the semiconductor package must be removed for some reason this can be quickly and easily accomplished by merely applying heat to all the bonded connections in the same manner as shown in FIG. 7.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. A receptacle adapted to be mounted on a circuit board for interconnecting it to a semiconductor package having a plurality of bonding pads spaced apart along one side, said receptacle comprising a central elongated body portion of non-conductive material;

guide means extending from one side of said body portion;

a series of metallic contact members spaced apart at predetermined intervals along the length of said body portion;

said contact members each having an upper portion extending beyond one side of said body portion between said guide means and a lower portion fixed within and extending downwardly through said body portion, said lower portions of each pair of adjacent contact members in said body portion being formed to extend downwardly in opposite directions so that on the lower surface of said body portion the contact members are aligned in two spaced apart lines that extend longitudinally along said body portion.

2. In combination, a circuit board of uniform thickness having conductive leads on its lower surface, a receptacle fixed to said circuit board, said receptacle having a generally channel-shaped planform with a central body portion and arm portions forming guide means that extend from opposite ends thereof, a series of metallic contact members spaced apart at predetermined intervals along the length of said body portion, said contact members each having a curved upper portion that extends above the top surface and beyond one side of said body portion and a lower portion that is fixed within and extends downwardly through said body portion and through said circuit board, said lower portions of adjacent contact members being formed to extend from the lower surface of said receptacle body portion in two spaced apart lines that extend longitudinally thereon, and means for connecting the lower ends of said contact members to said conductive leads on the lower surface of said circuit board.

* * * * *